United States Patent [19]

Engdahl

[11] 4,012,648
[45] Mar. 15, 1977

[54] PROCESS FOR MANUFACTURING PIEZOELECTRIC RESONATORS AND RESONATORS RESULTING FROM SUCH PROCESS

[75] Inventor: Jean Engdahl, Bienne, Switzerland

[73] Assignee: Societe Suisse pour l'Industrie Horlogere (SSIH) Management Services S.A., Bienne, Switzerland

[22] Filed: Apr. 28, 1975

[21] Appl. No.: 571,954

[30] Foreign Application Priority Data

May 6, 1974 Switzerland .................. 6107/74

[52] U.S. Cl. .................. 310/8.2; 29/25.35; 29/414; 29/593; 310/9.6; 333/72
[51] Int. Cl.² .................. H01L 41/08
[58] Field of Search .............. 29/25.35, 593, 413, 29/414; 333/72; 310/8.2, 9.4, 9.5, 9.6

[56] References Cited

UNITED STATES PATENTS

| | | | |
|---|---|---|---|
| 3,396,461 | 8/1968 | Spooner et al. | 29/413 |
| 3,488,530 | 1/1970 | Staudte | 333/72 |
| 3,683,213 | 8/1972 | Staudte | 333/72 |
| 3,756,851 | 9/1973 | Rennick et al. | 333/72 |
| 3,763,446 | 10/1973 | Toyoshima et al. | 333/72 |
| 3,906,260 | 9/1975 | Oguchi | 310/9.6 |

Primary Examiner—Carl E. Hall
Attorney, Agent, or Firm—Griffin, Branigan and Butler

[57] ABSTRACT

Resonators adapted to be supported from a single support arm are made by a process wherein the resonator and its support arm are blanked in a single piece from a flat plate of piezoelectric material. The resonator electrodes are formed on the resonator and conductors formed on the support arm in a single metallization operation. If desired, the support arm may be left attached to the flat plate by a region of reduced cross section after the blanking step. The metallization step may include metallization of a portion of the flat plate to form a circuit over the conductor to the electrodes. The resonator may then be vibrated and tested while its support arm is still attached to the flat plate by applying an electrical potential to the metallized portion of the plate. After testing, the resonator support arm may be broken away from the flat plate at the region of reduced cross section. Several resonators may be made simultaneously by the process from a single flat plate of piezoelectric material.

12 Claims, 11 Drawing Figures

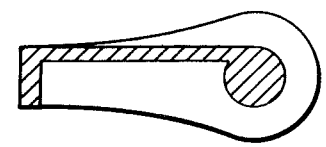
Fig. 5.
Fig. 5a
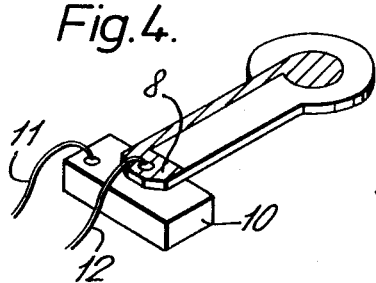
Fig. 4.
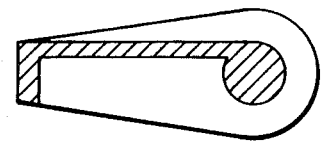
Fig. 5b
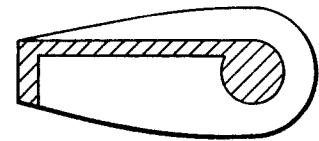
Fig. 5c
Fig. 6.
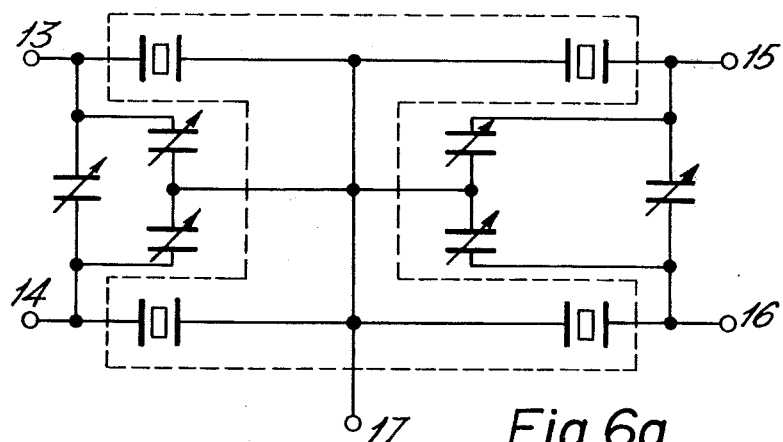
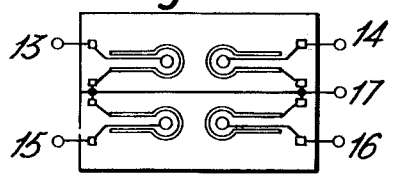
Fig. 6a

PROCESS FOR MANUFACTURING PIEZOELECTRIC RESONATORS AND RESONATORS RESULTING FROM SUCH PROCESS

This invention concerns a process for the manufacture of piezoelectric resonators or resonator assemblies such resonators being of the thickness shear type and covers as well the resonators and assemblies thereof resulting from the process. Piezoelectric resonators designed to operate above 1 MHz generally oscillate in the thickness shear mode and most often are of a circular form with diameters ranging most usually between 8 and 14 mm. It is known that the placing of electrodes at the centre of the resonator produces in view of the added mass a trapping of the vibrational energy which will be concentrated within the portion covered by the electrodes and will decrease exponentially into the zone which is not covered. Such resonators will be supported at the periphery and one may determine the minimal diameter in order to guarantee proper support without lowering the quality factor, taking into account the resonator thickness and electrode thickness, density and diameter. For a planar resonator operating at the lowest frequencies one is obliged to employ a large diameter which is not compatible with applications in which miniaturization is important. Alternatively, one might be obliged to use an electrode diameter so small that the dynamic capacity is insufficient for the use of the assembly as an oscillator.

To overcome these limitations one may provide the faces of the resonator with a spherical or conical form which leads to plano-convex resonators, biconvex resonators or bevelled resonators all well known. In such cases, however, the machining becomes very difficult and this, of course, increases the price to a prohibitive level for many applications.

Without taking into account the energy trapping phenomenon it has been suggested, in order to overcome the lowering of the quality factor owing to the support as for example in the British patent No. 447,665, to support the resonator by coupling members integral therewith and which preferably take the form of diametrically opposed arms having a reduced thickness relative to the resonator. Here again the machining is particularly difficult and the angles in the tuning of the resonator arm give rise moreover to undesirable reflections such that the proposed arrangement has practically never given satisfaction.

The purpose of the invention thus is to provide means for obtaining resonators operating in the thickness shear mode of small dimensions in which the lowering of the quality factor due to the support is avoided and at the same time the cost is kept within acceptable limits in view of a simplified machining process.

The resonators or resonator assemblies operating in the thickness shear according to the invention are obtained through blanking of a single piece which forms a portion intended to vibrate and is provided with electrodes and with a single arm intended for support and carrying conductors coupling the electrodes to the support zone. Preferably, the blanking is effected in a planar plate having uniform thickness and being of a piezoelectric material whereby several resonators or resonator assemblies may be obtained from the same plate. In a preferred form of the process each resonator is blanked about its entire periphery exclusive of the free extremity of the arm which remains united to the plate by a stressed point or region of reduced cross section which will be broken following the operation. The electrodes and conductors as well as conductive zones exterior to the arms, or electric connections between several resonators are obtained by a single metallization operation whereby the resonators may be tested separately in vibration or tuned to neighbouring frequencies all in the course of manufacture.

For a better understanding of the description reference will now be made to the accompanying drawings in which FIG. 1a shows an isolated resonator obtained in accordance with the process of the invention and superposed onto a prior art resonator.

FIG. 1b shows a variant having reduced diameter electrodes.

FIG. 2a + 2b show respectively two variants of resonator blanking from the same plate.

FIG. 4 shows an example of the mounting of an isolated resonator conforming with the invention.

FIG. 5a, b + c show respectively several different forms which may be given to the resonators.

FIG. 6 is diagram of a typical circuit employing resonators.

FIG. 6a is a top view of a structure functioning in accordance with the circuit diagram of FIG. 6.

The effect of the support of a thickness shear resonator on the quality factor thereof depends on the distance separating the support point from the edge of the electrode as well as the manner in which the energy decreases, this latter being a function of the electrode geometry. The distance between the edge of the electrode and the edge of the resonator actually is unimportant insofar as the resonator edge has a high quality factor which is to say the structure of the piezoelectric material does not differ from that of the resonator.

Figure 1A:
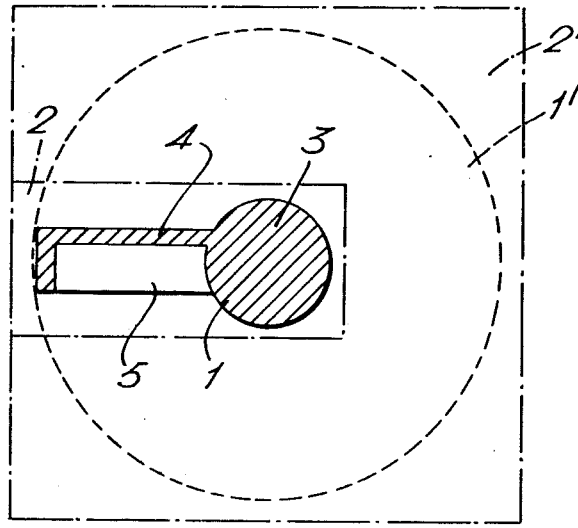
Figure 1B:
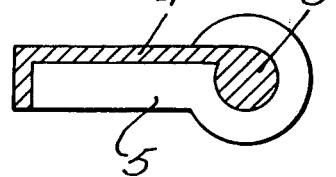

These aspects are considered for the realization of resonator 1 as shown in FIG. 1a. The latter is blanked, with its arm 5, out of a rectangular plate 2 represented by a dot-dash-outline. A prior art resonator 1' having the same performance is shown to the same scale superposed and blanked from plate 2'. It is immediately apparent that the space occupied and the quantity of material for the resonator of the invention are greatly reduced. In this form may equally be seen that the diameter of electrode 3 (shown hatched with conductor 4) relative to that of resonator 1 may be arbitrarily chosen as shown for example in FIG. 1b.

Figure 2A:
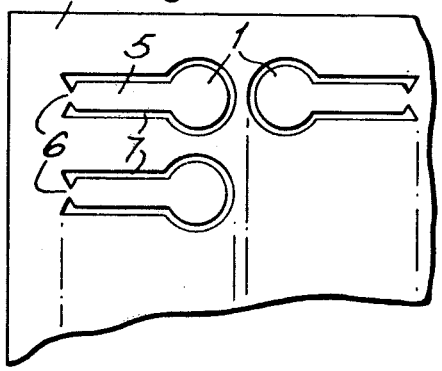
Figure 2B:
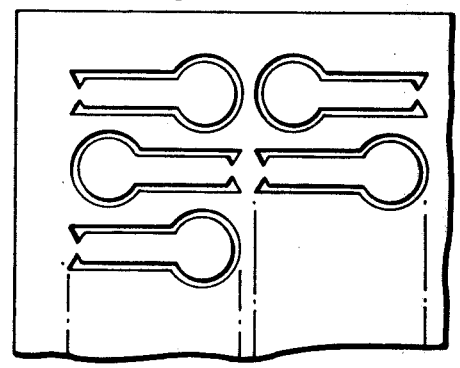

Machining of such a form of resonator may not be carried out by the same methods generally used for circular resonators. The invention thus relates initially to the obtaining of resonators by photochemical engraving or ultrasonic blanking. The recommended method includes initial machining of a thin plate cut from the chosen piezoelectric material. The thickness is adjusted in a manner that corresponds to the chosen frequency taking into account the modifications which will be subsequently introduced by the following treatment such as acid cutting and electrode deposit. FIG. 2a shows one manner in which several resonators may be blanked from a single plate 2 and FIG. 2b shows schematically a variant enabling a still greater economy of material.

Electrodes 3 and conductors 4 may be deposited by known means such as vacuum vaporization or cathode sputtering and can be precisely located either through the use of masks or through covering the entire resonator surface and subsequently removing the undesired portions through selective chemical attack for which the piezoelectric material is non-sensitive.

Figure 3:
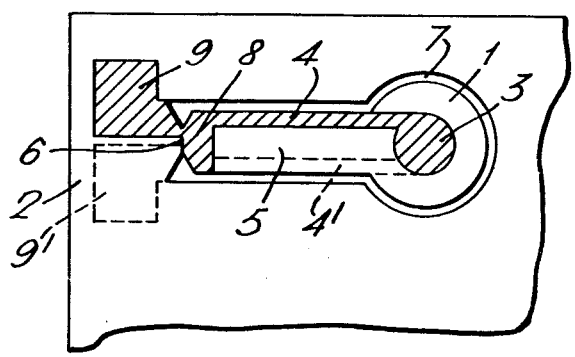
FIG. 3 shows a resonator still united with its original plate and shows the arrangement of metallization.

FIG. 3 gives details of a form of execution of the resonator according to the invention, thus resonator 1 remains united to plate 2 by arm 5, there being a stress concentration point or region of reduced cross section 6 where the plate and arm meet. The blanking is obtained about the entire circumference of the assembly comprising the resonator 1 and arm 5 with the exception of region 6 by means of removing a zone 7 of material through photo-chemical machining, ultrasonic blanking or any other similar process. Region 6 which intersects zone 7 is intended simply to be broken following the various operations in order to separate resonator 1 and its arm 5 from the remainder of plate 2. Electrode 3 is electrically coupled to the point connection and support 8 by conductor 4, the latter running along an edge of arm 5, with the conductor 4' for the opposite face as shown in dotted outlines running along the other edge of arm 5 in a manner such as to avoid piezoelectric excitation of arm 5. A metallized zone 9 is provided on plate 2 at the exterior of arm 5 without breaking the continuity with conductor 4 at region 6. The similar zone 9' on an opposite face of plate 2 is as in the case of conductor 4' arranged in a manner to avoid excitation of plate 2. Zones 9 and 9' enable excitation of resonator 1 during the manufacturing process in order to determine its characteristics and eventually provide corrections before separation from plate 2 through breaking off the resonator at region 6.

A typical series of manufacturing operations might be as follows:

a. Machining a thin plate 2 out of piezoelectric material of uniform thickness and of square or rectangular form. For quartz working at a frequency of 10 MHz the thickness would be 0.166 mm for an AT cut.
b. Placing the positioning marks as for example centering holes.
c. Covering plate 2 on both faces by a film of photosensitive material.
d. Appropriate light exposure across a mask designed to reproduce cuts 7.
e. Development leading to elimination of the film in all zones 7.
f. Cutting through zones 7 by means of a suitable acid or any other solvent for a given piezoelectric material.
g. Removal of the photosensitive material.
h. Cleaning by chemical material to which the piezoelectric material is non-sensitive.
i. Deposit of electrodes 3, conductors 4 and conductor zones 8 and 9 by vacuum evaporation with mask.
j. Placing of each resonator 1 into a circuit while still in the evaporator and adjusting of the frequency through deposit of additional metal on electrodes 3 by means of a removable mask.
k. Separation of resonators 1 with their arm 5 from plate 2 by flexing arm 5 thereby breaking off the arm at region 6.

The final mounting of the resonator in its circuit may be effected by simple clamping. Nevertheless to assure maximum strength it is preferable as shown in FIG. 4 to solder or weld the arrangement by one of its zones 8 onto a support 10 which itself is connected to a wire 11, the other zone 8 receiving a second wire 12 welded thereto and connected to the circuit.

The several forms of resonators described herein are only indicative of the numerous possibilities. As in the case of any resonator manufactured according to other methods they must be adapted to the desired parameters. The value of the dynamic capacity will be adjusted by the diameter of electrodes 3 which may cover the entire surface of resonator 1 or only a part thereof. Parasitic frequencies due to nonharmonic modes may be eliminated or diminished by a proper choice of the diameter, thickness and density of the electrodes.

Finally arm 5 may take various forms such as represented in FIGS. 5a, 5b and 5c with a view to eliminate any activity along the edges and parasitic vibrations originating from surface shear modes, bending or longitudinal modes of vibration.

An application which appears particularly interesting of the present invention comes from the fact that it is possible within a single plate of small dimensions to produce directly sets of several resonators for example filters with their various electrical connections already completed during the metallization operation. In respect of the process described hereinbefore the only difference would be to eliminate the region 6 whereby resonators 1 with their arms 5 would remain fixed to plate 2. In comparison with monolithic filters one will obtain the important advantage that coupling elements being external there will be no mechanical coupling between the resonators.

As one example there is shown in FIG. 6 the circuit of a Jaumann assembly with the corresponding four resonator plate and its terminals.

I claim:

1. A process for the manufacture of piezoelectric resonators operable in the thickness shear mode, said process comprising the steps of:
    blanking each said resonator and a single resonator support arm therefor from a plate of piezoelectric material as a single integral piece of said piezoelectric material, with said resonator being formed at one end of said support arm, said blanking step leaving each said resonator and its support arm in the plane of, but separated from, the plate from which it is blanked, except for a region of reduced cross section whereat the support arm remains attached to, but breakably detachable from the plate;
    applying electrodes to said resonators and conductors to said support arm; and
    breaking said resonators and their support arms from said plate at said region of reduced cross section, after applying said electrodes and conductors.

2. A process as claimed in claim 1 wherein a plurality of piezoelectric resonators are simultaneously blanked from a single plate of piezoelectric material.

3. A process as claimed in claim 1 wherein metal conductors are applied to said flat plate as said electrodes are applied to said resonators and said conductors are applied to said support arms whereby a continuous electric circuit is formed from a metal conductor on said flat plate to an electrode through a conductor on a support arm.

4. A process as claimed in claim 3 and further comprising the step of testing each resonator by applying an energizing excitation to said metal conductors.

5. A process as claimed in claim 4 wherein said resonators and their support arms are broken from said plate at said region of reduced cross section after said testing step has been completed.

6. A process as claimed in claim 3 and further comprising the step of tuning said resonators while applying an energizing excitation to said metal conductors.

7. A process as claimed in claim 1 wherein said support arms vary in width throughout their length from the regions of reduced cross section to the resonators.

8. A piezoelectric resonator made in accordance with the process as claimed in claim 1.

9. A process for the manufacture of piezoelectric resonators, said process comprising the steps of:
   simultaneously blanking said resonators and a single support arm for each of said resonators from a single plate of piezoelectric material, said blanking step leaving one end of each support arm attached to said plate with a resonator integrally formed with each said support arm at the other end thereof;
   simultaneously forming connecting circuitry on said plate, conductors on said support arms, and electrodes on said resonators;
   tuning said resonators while applying electrical excitation to said connecting circuitry; and
   separating said resonators and their support arms from said plate after tuning said resonators.

10. The process as claimed in claim 9 wherein said resonators are tuned to neighboring frequencies.

11. The process as claimed in claim 9 wherein said support arms formed during said blanking step have a varying width along their length to thereby eliminate undesirable vibration modes.

12. Piezoelectric resonators operating in the thickness shear mode and formed by the process as claimed in claim 9.

* * * * *